United States Patent
Bhatti et al.

(10) Patent No.: US 7,278,471 B2
(45) Date of Patent: Oct. 9, 2007

(54) MULTI-LAYERED MICRO-CHANNEL HEAT SINK

(75) Inventors: Mohinder Singh Bhatti, Amherst, NY (US); Ilya Reyzin, Williamsville, NY (US); Shrikant Mukund Joshi, Williamsville, NY (US)

(73) Assignee: Delphi Technologies, Inc., Troy, MI (US)

( * ) Notice: Subject to any disclaimer, the term of this patent is extended or adjusted under 35 U.S.C. 154(b) by 94 days.

(21) Appl. No.: 11/242,739

(22) Filed: Oct. 4, 2005

(65) Prior Publication Data

US 2007/0074856 A1 Apr. 5, 2007

(51) Int. Cl.
*F28F 7/02* (2006.01)
(52) U.S. Cl. .................. 165/104.33; 165/80.3
(58) Field of Classification Search ........... 165/104.33, 165/185, 146, 80.1–80.5; 361/699
See application file for complete search history.

(56) References Cited

U.S. PATENT DOCUMENTS

| 5,437,328 | A * | 8/1995 | Simons ....................... 165/185 |
| 5,527,588 | A * | 6/1996 | Camarda et al. ............ 428/188 |
| 5,697,428 | A * | 12/1997 | Akachi ................... 165/104.21 |
| 6,542,371 | B1 * | 4/2003 | Webb ......................... 165/185 |
| 6,989,134 | B2 * | 1/2006 | Tonkovich et al. .......... 165/167 |
| 7,123,479 | B2 * | 10/2006 | Chang et al. .......... 165/104.33 |
| 2002/0079087 | A1 * | 6/2002 | Vafai et al. ................ 165/80.4 |
| 2004/0066625 | A1 * | 4/2004 | Meyer et al. ............... 361/699 |
| 2005/0039885 | A1 | 2/2005 | Vaidyanathan ............. 174/16.3 |

* cited by examiner

*Primary Examiner*—Teresa J. Walberg
(74) *Attorney, Agent, or Firm*—Patrick M. Griffin

(57) ABSTRACT

The subject invention provides a heat sink for a liquid cooling system. The heat sink includes a spreader plate for contacting an electronic device and a body having a plurality of channels extending through the body and arranged in layers. Each layer includes a quantity of the channels decreasing in number with an increase in the distance from the electronic device, thus giving the heat sink a trapezoidal cross section perpendicular to the channels.

13 Claims, 5 Drawing Sheets

MULTI-LAYERED MICRO-CHANNEL HEAT SINK

BACKGROUND OF THE INVENTION

1. Field of the Invention

The subject invention provides a heat sink assembly for removing heat from an electronic device such as a microprocessor or a computer chip.

2. Description of the Prior Art

These electronic devices generate a high concentration of heat, typically a power density in the range of 5 to 35 W/cm$^2$. Accordingly, research activities have focused on developing more efficient cooling assemblies capable of efficiently dissipating the heat generated from such electronic devices, while occupying a minimum of space.

A forced air cooling assembly typically includes a heat exchanger and a heat sink, and cools the electronic device by natural or forced convection cooling methods. The electronic device is attached to the heat sink and transfers heat thereto. The heat exchanger typically uses air to directly remove the heat from the heat sink. However, air has a relatively low heat capacity. Such forced air cooling assemblies are suitable for removing heat from relatively low power heat sources with a power density in the range of 5 to 15 W/cm$^2$. However, the increased computing speeds have resulted in a corresponding increase in the power density of the electronic devices in the order of 20 to 35 W/cm$^2$, thus requiring more effective cooling assemblies.

In response to the increased heat produced by the electronic devices, liquid-cooled cooling assemblies, commonly referred to as liquid cooled units ("LCUs") were developed. The LCUs employ a heat sink in conjunction with a high heat capacity cooling fluid, like water or water-glycol solutions, to remove heat from these types of higher power density heat sources. One type of LCU circulates the cooling fluid through the heat sink to remove the heat absorbed from the heat source affixed thereto. The cooling fluid is then transferred to a remote location where the heat is easily dissipated into a flowing air stream with the use of a liquid-to-air heat exchanger and an air moving device such as a fan or a blower. These types of LCUs are characterized as indirect cooling units since they remove heat from the heat source indirectly by a secondary working fluid. Generally, a single-phase liquid first removes heat from the heat sink and then dissipates it into the air stream flowing through the remotely located liquid-to-air heat exchanger. Such LCUs are satisfactory for a moderate heat flux less than 35 to 45 W/cm$^2$.

The amount of heat transferred between the heat sink and the cooling fluid is dependent upon a heat transfer coefficient therebetween. The heat transfer coefficient is dependent upon a temperature gradient between the heat sink and the cooing fluid, with the higher heat transfer coefficient corresponding to higher temperature gradients, i.e., the higher the temperature gradient between the heat sink and the cooling fluid, the more heat the cooling fluid will remove. The amount of heat stored in the heat sink varies according to the distance from the heat source, with the highest concentration of heat occurring directly above the heat source in the base plate.

U.S. Patent Application 20050039885 to Vaidyanathan et. al. (the '885 application) discloses a heat sink for removing heat from an electronic device. The heat sink includes a body having a spreader plate for contacting the electronic device and a plurality of channels extending through the body for passing a cooling fluid therethrough. The body has a rectangular cross-section perpendicular to the channels with the channels arranged in layers stacked vertically upon the spreader plate. Accordingly, the heat sink of the '885 application stores less heat in the area of the heat sink farthest from the heat source, resulting in a lower temperature gradient between the heat sink and the cooling fluid in that area and a lowered heat transfer coefficient therebetween. Because the heat stored in the heat sink decreases with an increase in the distance from the heat source, a heat flux, which is the heat transferred to the cooling fluid per unit area of the heat sink decreases with an increase in the distance from the heat source as well.

SUMMARY OF THE INVENTION AND ADVANTAGES

The subject invention provides a heat sink assembly for removing heat from an electronic device. The assembly includes a body having a bottom surface and a top surface spaced therefrom. The body defines a plurality of channels extending through the body in parallel relationship to the bottom surface and aligned in a plurality of layers stacked vertically between the bottom surface and the top surface. Each of the plurality of layers includes at least one of the plurality of channels. A first of the layers is adjacent the bottom surface and a second of the layers is adjacent the top surface. The first layer includes a thermal capacity for transmitting heat to a fluid flowing through the plurality of channels. The second layer includes a thermal capacity less than the thermal capacity of the first layer for transferring a lesser quantity of heat than the first layer to the fluid.

Accordingly, the subject invention progressively reduces the thermal capacity of each layer as the layers increase in distance from the heat source. Since there is less heat stored in the heat sink farther from the heat source, the required contact area for each layer decreases as the layers increase in distance from the heat source. Therefore, the subject invention provides an efficient heat sink assembly that maintains a constant heat flux throughout the heat sink assembly by maximizing the heat transfer rate per unit area of the heat sink.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Referring to the Figures, wherein like numerals indicate corresponding parts throughout the several views, a heat sink 20 assembly is shown generally at 20.

Figure 1:
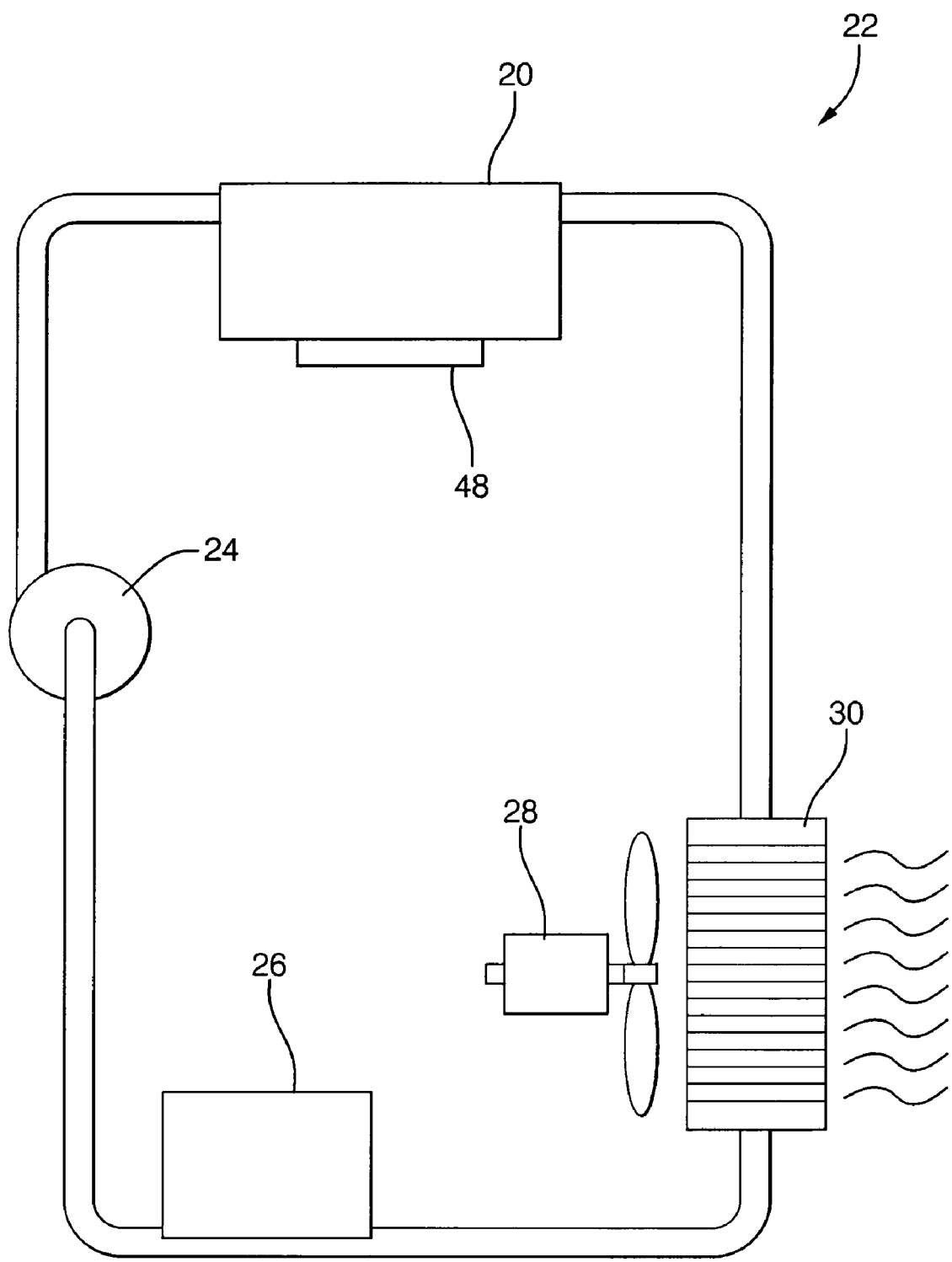
FIG. 1 is a schematic view of a liquid cooling system.
Figure 2:
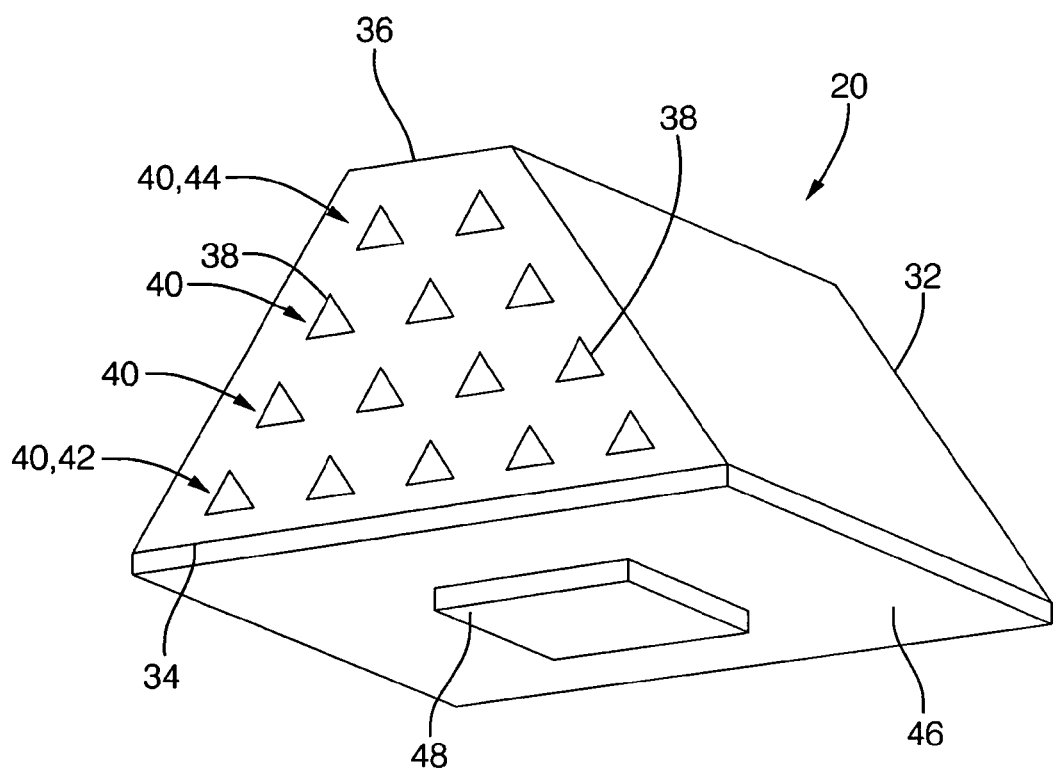
FIG. 2 is a perspective view of a heat sink assembly.
Figure 3:
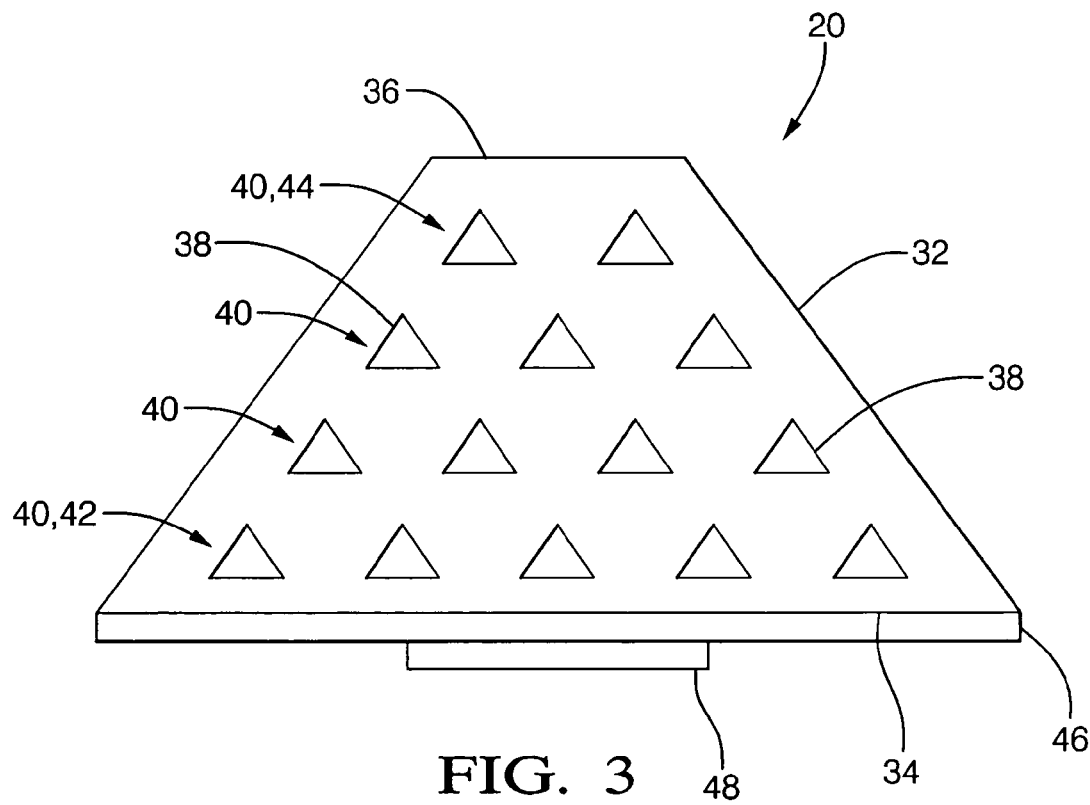
FIG. 3 is an end view of the heat sink assembly.

Referring to FIG. 1, the operation of the heat sink 20 is incorporated into a liquid cooling system, generally shown at 22. A working fluid mover, such as a pump 24, moves the flow of cooling fluid, usually a liquid, through a cooling fluid storage tank 26, which stores excess cooling fluid. The pump 24 moves the cooling fluid through a heat exchanger to dissipate heat from the cooling fluid. The heat exchanger includes a fan 28 and a radiator 30. The radiator 30 can be of the well known type including tubes with cooling fins between the tubes to exchange heat between the cooling fluid passing through the tubes and air forced through the radiator 30 by the fan 28.

The heat sink 20 includes a body 32 having a bottom surface 34 and a top surface 36 spaced therefrom. The body 32 defines a plurality of channels 38 extending through the body 32 in parallel relationship to the bottom surface 34. The plurality of channels 38 is aligned in a plurality of layers shown generally at 40 and stacked vertically between the bottom surface 34 and the top surface 36. Each of the plurality of layers 40 includes at least one of the plurality of channels 38. The plurality of layers 40 includes a first layer, generally shown at 42, adjacent the bottom surface 34. The plurality of layers 40 further includes a send layer, generally shown at 44, adjacent the top surface 36 with the remaining layers disposed therebetween. A spreader plate 46 is adjacent the bottom surface 34. The spreader plate 46 contacts an electronic device 48 (heat source) and transmits heat produced by the electronic device 48 to the body 32. The body 32 includes a trapezoidal cross section perpendicular to the plurality of channels 38. Since the heat transfer area within the trapezoidal cross section parallel to the spreader plate 46 decreases with an increase in the distance from the electronic device 48, the heat flux (heat transfer per unit area of the heat sink 20) remains substantially constant throughout the upwardly tapered trapezoidal body 32 with a proportionate decrease in the heat conduction area.

Each of the plurality of layers 40, including the first layer 42 and the second layer 44, includes a thermal capacity for transmitting heat to the fluid flowing through the plurality of channels 38. The thermal capacity of each of the plurality of layers 40 progressively decreases from the thermal capacity of the first layer 42. Accordingly, the thermal capacity of the second layer 44 is less than the thermal capacity of the first layer 42 and transfers a lesser quantity of heat to the fluid than the first layer 42. In other words, the thermal capacity of each layer 40 is less than the thermal capacity of the layer 40 directly beneath it and closer to the electronic device 48, and greater than the thermal capacity of the layer 40 directly above it and farther from the electronic device 48.

Each of the plurality of channels 38 includes an identical cross section. The cross section may include any shape, such as a circular shape, a polygonal shape, or a cusped shape. The channels 38 in each of the plurality of layers 40 progressively decrease in number from the first layer 42 to the second layer 44 for progressively decreasing the thermal capacity of each of the plurality of layers 40. The number of channels 38 in each of the layers 40 controls the contact area between the heat sink 20 and the cooling fluid. Decreasing the number of channels 38 in a layer 40 decreases the contact area and reduces the thermal capacity for transferring heat.

By progressively reducing the number of channels 38 in each layer 40, the thermal capacity for transferring heat of each layer 40 is progressively reduced. This allows the heat flux to remain substantially constant throughout the heat sink 20 because there is less heat stored in the heat sink 20 farther from the electronic device 48, thus requiring less contact area between the heat sink 20 and the cooling fluid to remove the lesser amount of heat.

Figure 4:
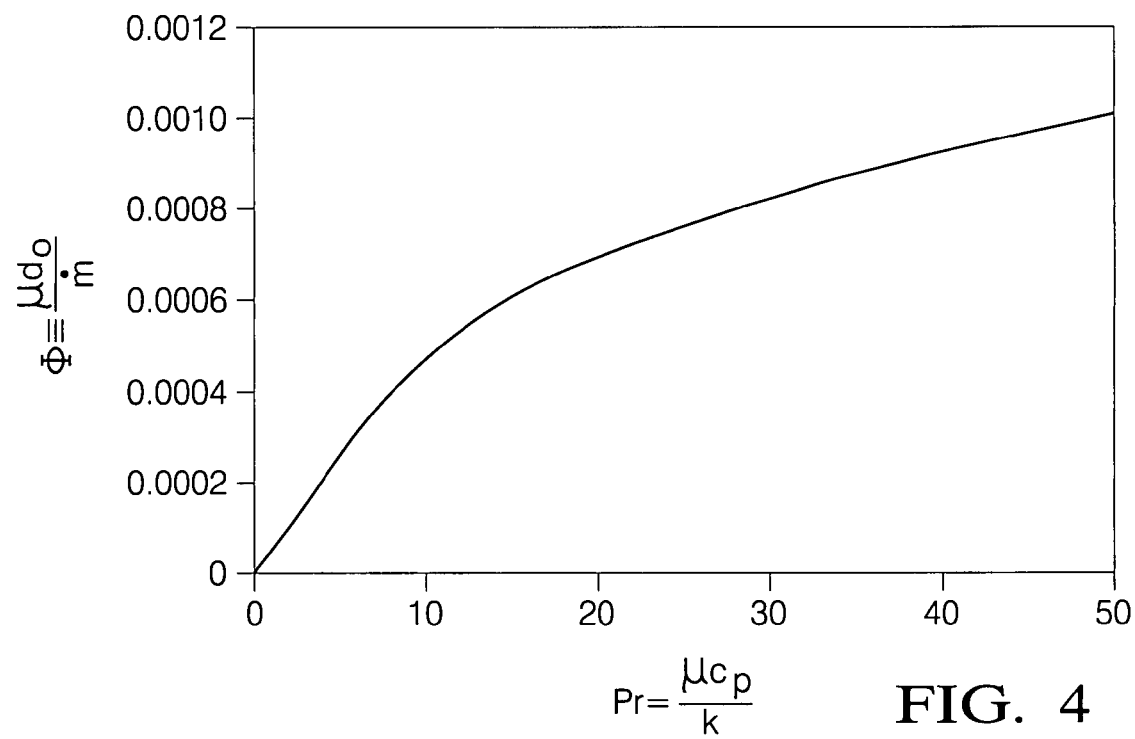
FIG. 4 is a graph of a channel flow parameter vs. a channel property parameter.
Figure 5:
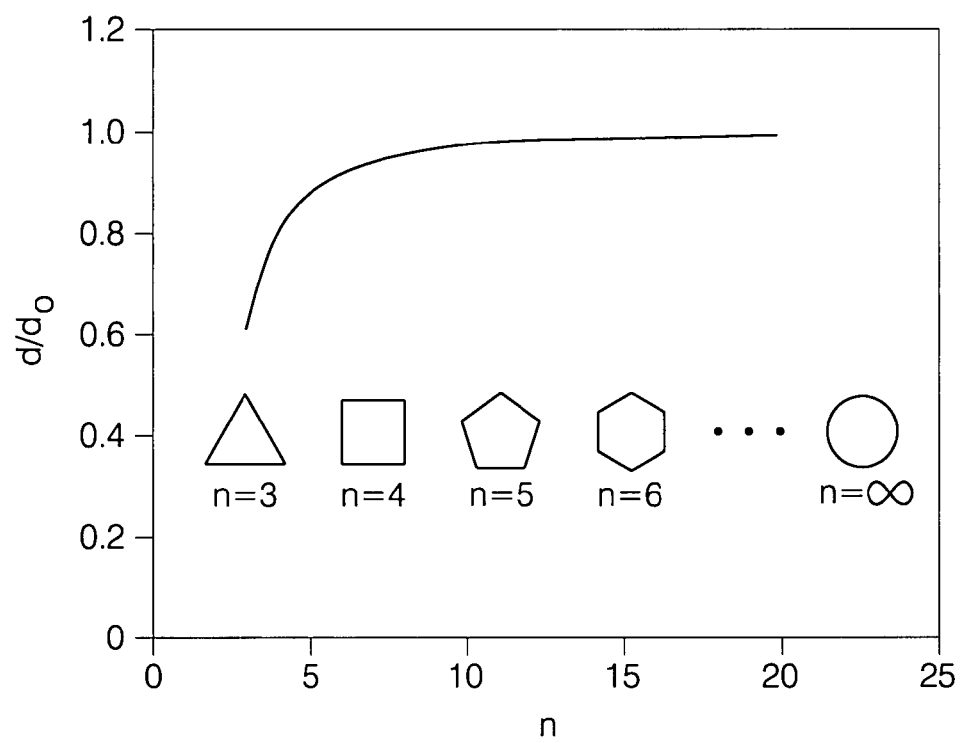
FIG. 5 is a graph of a hydraulic diameter ratio for a polygonal channel.
Figure 6:
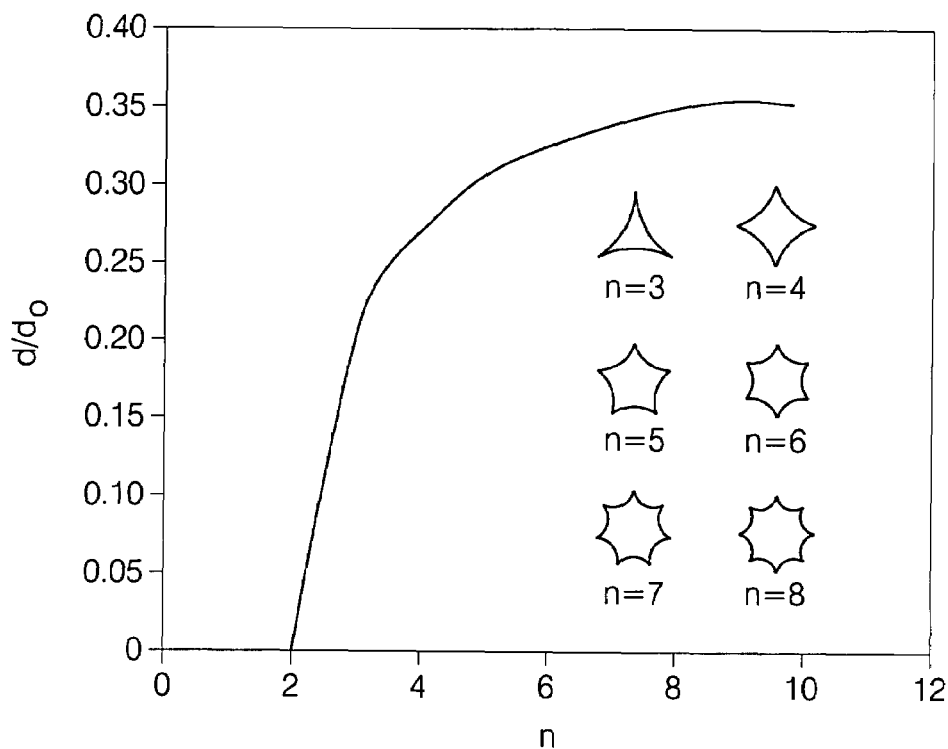
FIG. 6 is a graph of the hydraulic diameter ratio for a cusped channel.
Figure 7:
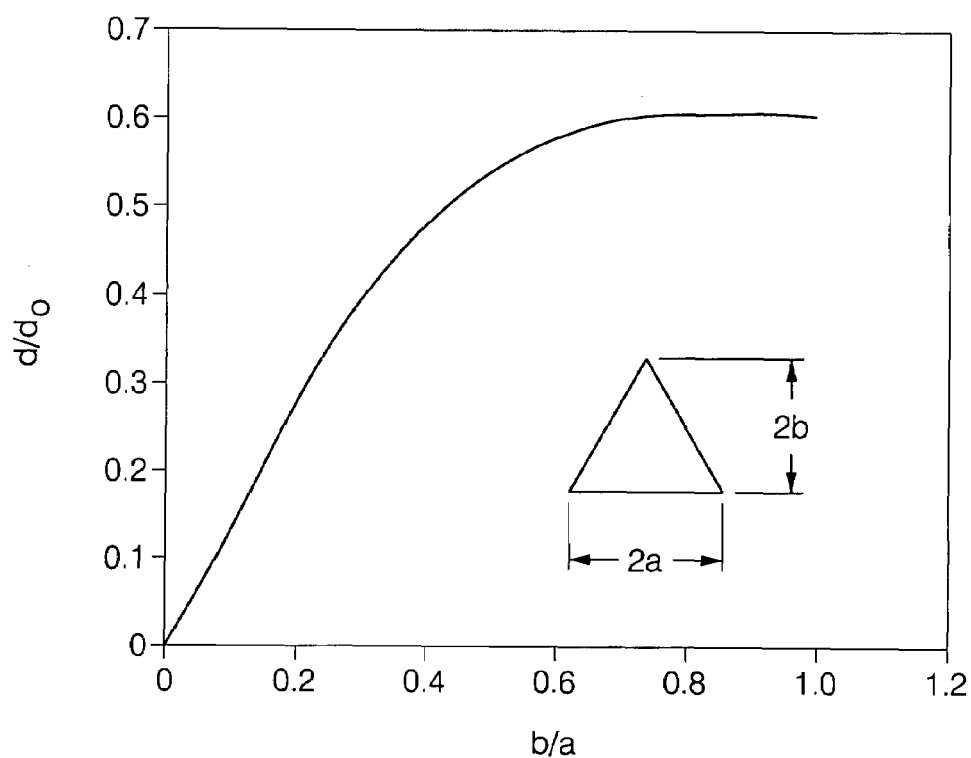
FIG. 7 is a graph of the hydraulic diameter ratio for an isosceles triangular channel.
Figure 8:
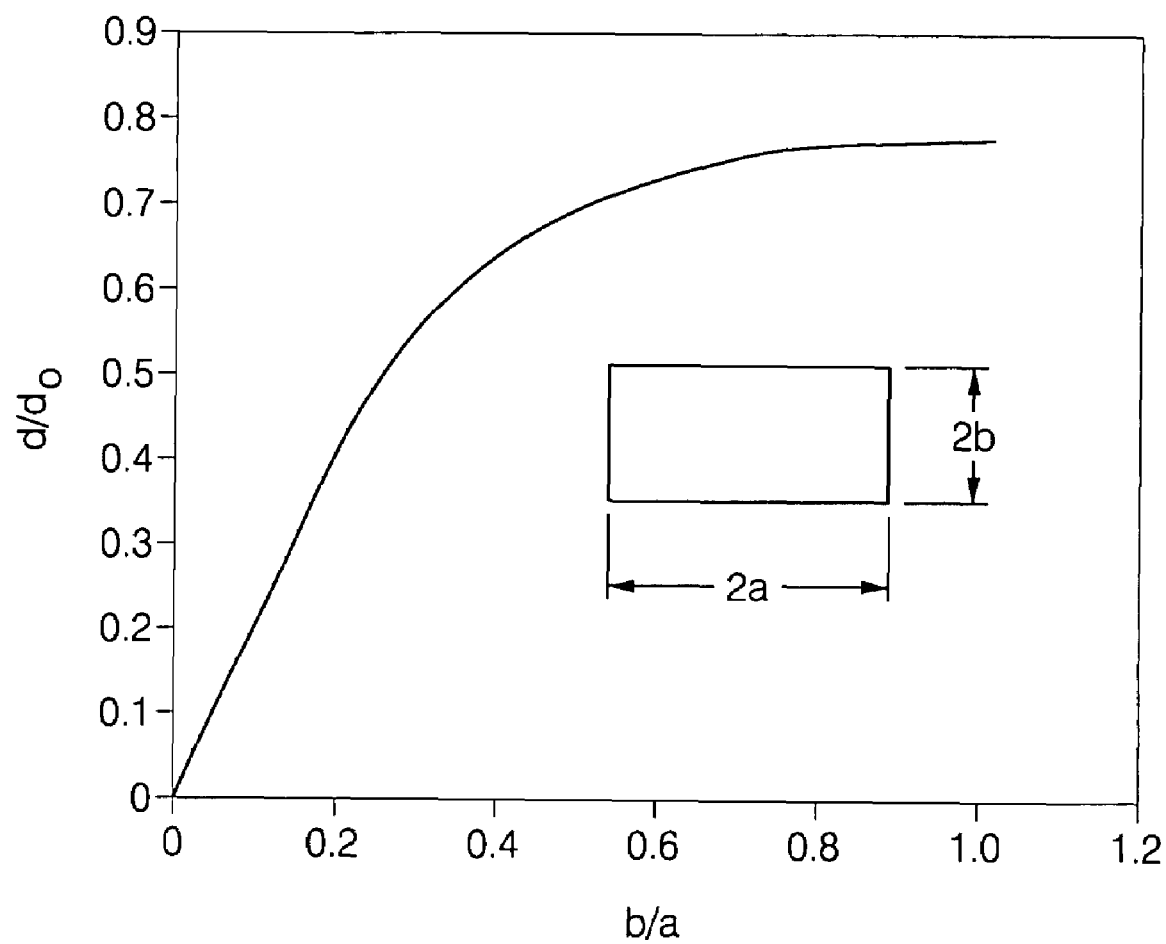
FIG. 8 is a graph of the hydraulic diameter ratio for a rectangular channel.

The plurality of channels 38 includes a hydraulic diameter (d) defined by the equation:

$$d = \frac{4A}{P} \tag{1}$$

where A is the cross sectional area of one of the channels 38, and P is the perimeter of one of the channels 38. For a circular channel the hydraulic diameter is denoted as $d_o$, and in accordance with the defining Equation (1) is synonymous with the physical diameter of a circular channel. According to the teachings of the subject invention, the optimum hydraulic diameter of the circular channel ($d_o$) is defined by the equation:

$$d_o = \frac{\dot{m}\Phi}{\mu} \tag{2}$$

where $\dot{m}$ is the mass flow rate of the fluid flowing through each of the plurality of the channels 38, $\mu$ is a dynamic viscosity of the fluid flowing through the plurality of channels 38, and $\Phi$ is a dimensionless flow parameter presented in FIG. 4 as a function of the dimensionless property parameter (Pr) of the fluid flowing through the plurality of channels 38. The dimensionless property parameter (Pr) is defined by the equation:

$$Pr = \frac{\mu c_p}{k} \tag{3}$$

where $\mu$ is the dynamic viscosity of the fluid flowing through the plurality of channels 38, $c_p$ is the isobaric specific heat of the fluid flowing through the plurality of channels 38, and k is the thermal conductivity of the fluid flowing through the plurality of channels 38.

The optimum hydraulic diameter (d) of the plurality of channels 38 having a non-circular cross section can be determined as follows with the aid of FIG. 4. For the given fluid flowing through the plurality of channels 38, determine the fluid property parameter (Pr). Corresponding to this value of the fluid property parameter (Pr), read the value the dimensionless flow parameter ($\Phi$) from FIG. 4. Knowing the value of $\Phi$, together with the mass flow rate m through each of the plurality of channels 38 and the dynamic viscosity $\mu$ of the fluid flowing through the plurality of channels 38, determine the optimum hydraulic diameter ($d_o$) of a channel 38 having a circular cross section. Thus knowing the optimum hydraulic diameter ($d_o$) of the circular channel, the optimum hydraulic diameter (d) of the non-circular channel 38 can be determined from the ratio The ratio $$\left(\frac{d}{d_o}\right)$$

for a variety specific non-circular channels are given in FIGS. 5 through 8. Analysis of these figures allows an individual to optimize the channels 38 for their specific specifications.

The foregoing invention has been described in accordance with the relevant legal standards; thus, the description is exemplary rather than limiting in nature. Variations and modifications to the disclosed embodiment may become apparent to those skilled in the art and do come within the scope of the invention. Accordingly, the scope of legal protection afforded this invention can only be determined by studying the following claims.

What is claimed is:

1. A heat sink assembly for removing heat from an electronic device, said assembly comprising;
   a body including a bottom surface having a bottom width and a top surface having a top width spaced therefrom, wherein said bottom width is greater than said top width, and defining a plurality of channels extending through said body in parallel relationship to said bottom surface and aligned in a plurality of layers stacked vertically between said bottom surface and said top surface and with each of said plurality of layers including at least one of said plurality of channels,
   a first of said layers adjacent said bottom surface and a second of said layers adjacent said top surface,
   said first layer including a thermal capacity for transmitting heat to a fluid flowing through said plurality of channels and said second layer including a thermal capacity less than said thermal capacity of said first layer for transferring a lesser quantity of heat to the fluid than said first layer, thereby providing a substantially constant heat flux from said bottom surface to said top surface.

2. An assembly as set forth in claim 1 wherein each of said plurality of layers includes a thermal capacity progressively decreasing from said thermal capacity of said bottom layer.

3. An assembly as set forth in claim 2 wherein each of said plurality of channels includes an identical cross section.

4. An assembly as set forth in claim 3 wherein said channels in each of said plurality of layers progressively decrease in number from said bottom layer for progressively decreasing the thermal capacity of each of said layers.

5. An assembly as set forth in claim 4 wherein said body includes a spreader plate adjacent said bottom surface for contacting the electronic device and transmitting heat produced by the electronic device to said body.

6. An assembly as set forth in claim 5 wherein said cross section of said plurality of channels includes a circular shape.

7. An assembly as set forth in claim 5 wherein said cross section of said plurality of channels includes a polygonal shape.

8. An assembly as set forth in claim 5 wherein said cross section of said plurality of channels includes a cusped shape.

9. An assembly as set forth in claim 5 wherein said assembly includes a pump for circulating a flow of the fluid to said plurality of channels.

10. An assembly as set forth in claim 9 wherein said assembly includes a heat exchanger for removing heat from the fluid exiting said plurality of channels.

11. An assembly as set forth in claim 10 wherein said assembly includes a tank for storing the fluid.

12. An assembly as set forth in claim 1 wherein said assembly includes a side surface tapered from said bottom surface to said top surface defining a substantially trapezoidal cross sectional area.

13. An assembly as set forth in claim 12 wherein said plurality of channels are substantially perpendicular to said trapezoidal cross sectional area.

* * * * *